US005142169A

United States Patent [19]

Hüser

[11] Patent Number: 5,142,169

[45] Date of Patent: Aug. 25, 1992

[54] APPARATUS FOR IDENTIFYING A SECOND OF TWO SUCCESSIVE PULSES OF THE SAME POLARITY IN A PULSE TRAIN OF POSITIVE AND NEGATIVE PULSES FOR GENERATION OF SYNCHRONIZATION PULSES FOR AN INTERNAL COMBUSTION ENGINE

[75] Inventor: Klaus Hüser, Stuttgart, Fed. Rep. of Germany

[73] Assignee: Robert Bosch GmbH, Stuttgart, Fed. Rep. of Germany

[21] Appl. No.: 573,193

[22] PCT Filed: Mar. 18, 1988

[86] PCT No.: PCT/EP88/00220

§ 371 Date: Jul. 27, 1990

§ 102(e) Date: Jul. 27, 1990

[87] PCT Pub. No.: WO89/08774

PCT Pub. Date: Sep. 21, 1989

[51] Int. Cl.[5] .......................... H03K 5/13; H03K 5/22; H02B 1/24

[52] U.S. Cl. .................................... 307/518; 307/269; 307/236; 307/127; 328/118; 324/166

[58] Field of Search ............... 307/269, 510, 518, 527, 307/236, 234; 328/118, 119, 120, 57, 109, 127; 324/160, 166. 207.25

[56] References Cited

U.S. PATENT DOCUMENTS

| | | | |
|---|---|---|---|
| 3,272,995 | 9/1966 | Alexander et al. | 307/518 |
| 4,293,814 | 10/1981 | Boyer | 324/166 |
| 4,532,437 | 7/1985 | Bodig et al. | 324/166 |

*Primary Examiner*—Stanley D. Miller
*Assistant Examiner*—Shih Tran
*Attorney, Agent, or Firm*—Michael J. Striker

[57] ABSTRACT

Synchronization pulses for an internal combustion engine are generated by identifying the second of two consecutive pulses of the same polarity in a pulse train of positive going and negative going pulses. An evaluation pulse sequence is generated which switches from a low level to a high level in response to a positive going pulse and from the high level to a low level in response to a negative going pulse. A synchronization pulse is generated in response to a differentiated pulse derived from the pulse train when the level of the evaluation pulse sequence indicates that a switching pulse of said same polarity as that of the differentiated pulse has just occurred.

10 Claims, 2 Drawing Sheets

APPARATUS FOR IDENTIFYING A SECOND OF TWO SUCCESSIVE PULSES OF THE SAME POLARITY IN A PULSE TRAIN OF POSITIVE AND NEGATIVE PULSES FOR GENERATION OF SYNCHRONIZATION PULSES FOR AN INTERNAL COMBUSTION ENGINE

BACKGROUND OF THE INVENTION

This invention relates to apparatus for electronically generating synchronization pulses for an internal combustion engine.

In an internal combustion engine having a fuel injection system or some other operation which must be synchronized with engine rotation, it is necessary to generate a timing signal identifying the rotational position of the engine for controlling the operation. The timing signal is usually in the form of periodically generated synchronization pulses which occur in relation to the top dead center position of a specified engine cylinder.

In many known systems the synchronization pulses are derived from a voltage signal produced by a detector or sensor which indicates the engine speed and crankshaft position.

For example the synchronization pulses may be derived from the voltage signal produced by a crankshaft transmitter. This voltage signal typically consists of a series of alternate positive and negative pulses generated as the crankshaft rotates, with an additional pulse being generated at a certain reference position, e.g.; the top dead center position of the first cylinder.

In one known system the crankshaft transmitter is placed adjacent a slotted or toothed disc which rotates with the crankshaft. The transmitter produces alternate positive and negative pulses as the teeth pass it. A magnet is provided at the reference position and thus an extra pulse is generated each time the magnet passes the sensor.

The voltage signal from the crankshaft transmitter thus consists of a series of alternate negative and positive pulses with two consecutive pulses of the same sense at regular intervals.

It is possible to generate, from the crankshaft transmitter voltage, a pulse sequence which switches from a first level to a second level in response to a negative going pulse and from the second level to the first level in response to a positive going pulse. This pulse sequence is hereinafter referred to as the negative/positive evaluation signal. This has been achieved using an integrated circuit together with a number of external components and has been used in many hybrid electronic ignition devices. Suitable circuitry for generating such a pulse sequence is described in detail in DE-OS 3208262.

It is desirable to generate the synchronization pulses from the crankshaft transmitter voltage using as little as possible additional circuitry.

In hybrid devices only a limited space can be made available for implementing the circuit. This means that all functions additionally needed must be incorporated into existing or new integrated components. It is obviously advantageous, to incorporate additional functions into existing components wherever possible.

It has been proposed to utilise the circuitry for generating the negative/positive evaluation signal for generating the synchronization pulses. However, the previous proposals have required modifications to the integrated circuit.

SUMMARY OF THE INVENTION

The present invention provides apparatus for identifying the second of two consecutive pulses of the same polarity in a pulse train of positive going and negative going pulses, the apparatus comprising means for generating an evaluation pulse sequence which switches from a first level to a second level in response to a positive going pulse and from the second level to the first level in response to a negative going pulse means for differentiating the positive and negative going pulses; and means for generating a synchronization pulse in response to differentiated pulse which coincides with a level of the evaluation pulse sequence that has been switched by a pulse of the same polarity in the pulse train as that of said differentiated pulse.

Preferably the synchronization pulse generation means is enabled and disabled in response to changes of level in the evaluation pulse sequence. Thus, the synchronization pulse generation means is only enabled when the evaluation pulse sequence is at said level indicating that a second consecutive pulse of same polarity has occurred.

The present invention may thus be very simply accommodated in a known circuit for generating a negative/positive evaluation signal. The evaluation signal is simply used to control a further pulse generator for generating synchronization pulses. The two pulse generators may be incorporated in the same integrated circuit.

BRIEF DESCRIPTION OF THE DRAWING

An embodiment of the invention will now be described by way of example only and with reference to the accompanying drawings, in which.

DETAILED DESCRIPTION OF THE PREFERRED EMBODIMENT

Figure 1:
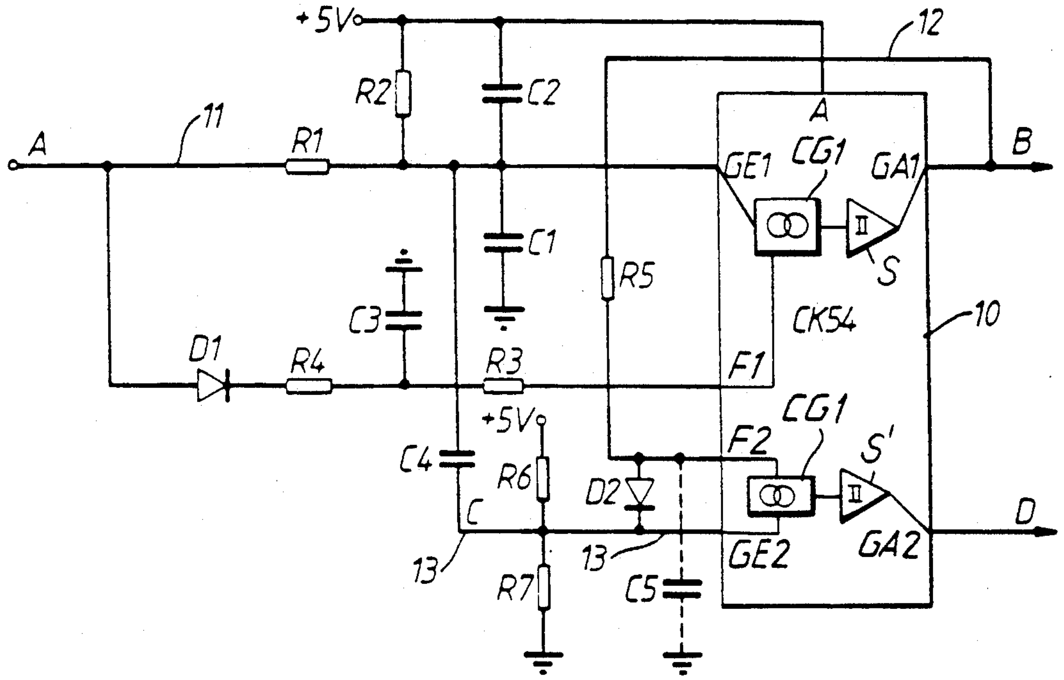
FIG. 1 is a diagram of a circuit embodying the present invention.
Figure 2:
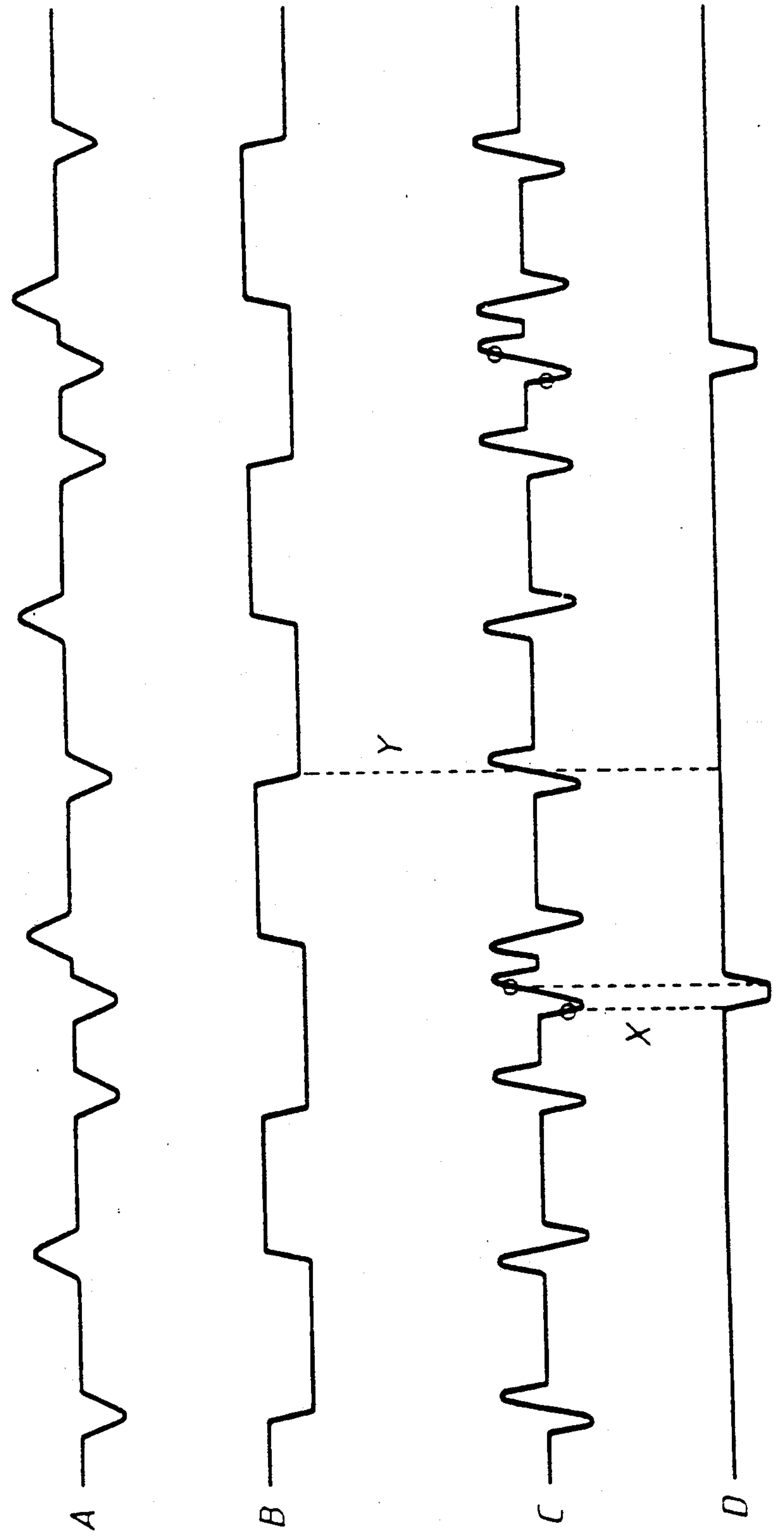
FIG. 2 shows the waveforms of voltages at different places in the circuit of FIG. 1 on parallel time axes.

The crankshaft transmitter voltage is applied to the input GE1 of an integrated circuit 10 along line 11 via resistor R1. The waveform of the voltage at point A in the circuit is shown in FIG. 2. The circuitry comprising input terminals GE1, F1 output terminal, GA1 of the integrated circuit and the external components R1, R2, R3, R4; C1, C2, C3 and D1 produces the negative/positive evaluation signal at point B. An output waveform is produced at B which switches from a first level to a second level when the voltage at A drops below a first threshold level and switches from the second level back to the first level when the voltage at A rises above a second threshold level. In the illustrated example as seen in FIG. 1, the integrated circuit includes two constant current generators $CG_1$ connected between GE1 and a Schmitt triggers whose output is connected to GA1. The input F1 is a control input for the constant current generators $CG_1$.

The generation of the synchronization pulses is implemented by resistors R5, R6, R7, a capacitor C4 and input terminals GE2, F2 and output terminals GA2 of the integrated circuit. As with GE1, GA1 and F1, two other constant current generators $CG_2$ are connected between GE2 and a Schmitt triggers' whose output is connected to GA2. F2 is the control input for the other constant current generators. The output terminal GA1 of the integrated circuit 10, delivering the negative/-positive evaluation signal to point B, is fed back to the input terminal F2 along a line 12 via resistor R5. Capacitor C4 operates to differentiate the crankshaft transmitter voltage applied to the input terminal GE1. The differentiated signal from the capacitor is applied along a line 13 to input the terminal GE2 via the junction of resistors R6 and R7 which form a potential divider.

Referring to FIG. 2, the crankshaft transmitter voltage A consists of a series of alternate positive and negative pulses with two consecutive negative pulses at regular intervals. The negative/positive evaluation signal at point B switches from high potential to low potential when the crankshaft transmitter voltage at point A drops below a certain negative potential and from low potential to high potential when the crankshaft transmitter voltage rises above a certain positive potential. This switching is brought about by the Schmitt triggers. Thus, the second of two consecutive negative pulses from the transmitter has no effect on the negative/positive evaluation signal because at this stage the Schmitt trigger is already off.

The output voltage of the capacitor C4 at point C in the circuit is shown in FIG. 2. The synchronization signal from the output terminal GA2 at point D in the circuit is also shown in FIG. 2. Referring to the region marked X in the capacitor output waveform at C, the voltage at D from output terminal GA2 switches from high to low potential when the capacitor voltage at C drops below a first predetermined level and from low to high potential when the capacitor voltage rises above a second predetermined level. The circuit of FIG. 1 distinguishes the second of two consecutive negative pulses from the first one by actuating the output terminal GA2 only after the evaluation signal at B after GA1 has gone to low potential. Referring to the region marked Y in the capacitor output waveform at C it can be seen that by the time the evaluation signal at B switches to low potential the capacitor voltage at C has already risen above the first predetermined level and so the synchronization signal at D does not switch to low potential.

The detailed operation of the circuit is as follows: when output GA1 (point B) is at high, the input F2 drives constant current sources $CG_2$ at the input GE2 into conduction to such an extent that the current of the differentiated pulse from GE1 via C4 (point C) cannot cause the current sources at GE2 to switch. If output GA1 is at low potential, the constant current sources $CG_2$ are almost cut off by F2. This switching-off process can be extended by control input an additional capacitor C5 shown in dotted lines, if required. The operation point for GE2 is then determined by the voltage at the junction between resistors R6 and R7. If C4 is correctly dimensioned, GA2 switches to low with the next negative edge at GE1 i.e. the next negative pulse from the transmitter as shown in FIG. 2.

If the falling edges of negative pulses and rising edge with positive are steeper than their associated rising and falling edges respectively, it is possible to switch GA2 only at the steeper edges by appropriate dimensioning of C4, R6, R7.

Under certain circumstances it may be necessary to insert a further diode D2, shown in FIG. 1, between lines 12 and 13 for a defined switching to high of GA2 with the positive pulse.

The circuit described above has a number of advantages over previously proposed arrangements. Firstly, the previous proposals all require additional hardware expenditure, for example flip flops and analogue amplifiers.

Because space in hybrid devices is limited this necessitates development of new integrated circuits or reworking of existing integrated circuits. The present invention saves time and cost on reworking and development since existing functions of the integrated circuit can be utilised.

The circuit is particularly versatile since the differing edge steepnesses can be utilised by appropriate dimensioning of the components.

I claim:

1. An apparatus for identifying the second of two consecutive pulses of the same polarity in a pulse train (A) of positive and negative pulses, comprising means for generating an evaluation pulse sequence connected to receive said pulse train, said evaluation pulse sequence switching from a first level to a second level when a positive pulse in said pulse train is received by said means for generating the evaluation pulse sequence, and from the second level to the first level when a negative pulse in said pulse train is received by said means for generating the evaluation pulse sequence; means for differentiating the positive and negative pulses of the pulse train (A) connected to receive said pulse train (A) so as to produce a differentiated pulse when a positive or a negative pulse is received by said means for differentiating; and means for generating a synchronization pulse connected to said means for differentiating to receive said differentiated pulses therefrom and connected to said means for generating said evaluation pulse sequence to receive said evaluation pulse sequence therefrom, so that one of the synchronization pulses is generated when a differentiated pulse coincides with a level of the evaluation pulse sequence which had been switched by a pulse in the pulse train having the same polarity as that of said differentiated pulse.

2. Apparatus as claimed in claim 1 in which the synchronization pulse generation means is enabled and disabled in response to changes of level in the evaluation pulse sequence.

3. Apparatus as claimed in claim 1 in which the train of pulses is conveyed to the synchronization pulse generation means via the differentiating means (C4).

4. Apparatus as claimed in claim 3 in which the differentiating means comprise a capacitor.

5. Apparatus as claimed in claim 4 in which the synchronization pulse generation means is arranged when enabled to switch from a first level to a second level when the capacitor output voltage falls below a first predetermined value and to switch from the second level to the first when the capacitor output voltage rises above a second predetermined level.

6. Apparatus as claimed in claim 1 in which the means for generating a first pulse sequence and the means for generating the synchronization pulses are incorporated in an integrated circuit.

7. Apparatus as claimed in claim 1 wherein the means for generating the first pulse sequence and the means for generating the synchronization pulses each comprise two constant current generators connected to a threshold switching device.

8. Apparatus as claimed in claim 7 in which the evaluation pulse sequence is used to control the two constant current generators of the means for generating the synchronization pulses.

9. Apparatus as claimed in claim 7 in which the constant current generators and the threshold switching devices are incorporated in an integrated circuit.

10. Apparatus as claimed in claim 7, in which each of the threshold switching devices comprises a Schmitt trigger.

* * * * *